(12) United States Patent
Van Der Vleuten

(10) Patent No.: US 6,460,183 B1
(45) Date of Patent: Oct. 1, 2002

(54) APPARATUS FOR RECEIVING SIGNALS

(75) Inventor: Renatus J. Van Der Vleuten, Eindhoven (NL)

(73) Assignee: U.S. Philips Corporation, New York, NY (US)

(*) Notice: Subject to any disclaimer, the term of this patent is extended or adjusted under 35 U.S.C. 154(b) by 0 days.

(21) Appl. No.: 09/313,545

(22) Filed: May 14, 1999

(30) Foreign Application Priority Data

May 20, 1998 (EP) .......................................... 98201686

(51) Int. Cl.[7] .......................... H04N 7/16; H04N 7/173
(52) U.S. Cl. .......................... 725/139; 725/46; 725/52; 725/112
(58) Field of Search .................... 348/10, 906, 731, 348/732, 734; 455/186.1, 186.2; 709/205, 217, 219; 725/39, 46, 52, 112, 9, 14, 139

(56) References Cited

U.S. PATENT DOCUMENTS

| | | | | |
|---|---|---|---|---|
| 5,083,205 A | * | 1/1992 | Arai ............................ 358/140 |
| 5,323,240 A | | 6/1994 | Amano et al. ............... 348/731 |
| 5,585,865 A | * | 12/1996 | Amano et al. ............... 348/731 |
| 5,631,707 A | * | 5/1997 | D'Errico ...................... 348/461 |
| 5,635,996 A | * | 6/1997 | Okamura ..................... 348/732 |
| 5,734,444 A | * | 3/1998 | Yoshinobu ................... 348/731 |
| 5,757,414 A | * | 5/1998 | Throne ........................... 348/1 |
| 5,758,257 A | * | 5/1998 | Herz et al. ...................... 455/2 |
| 5,801,747 A | * | 9/1998 | Bedard ............................ 348/1 |
| 5,973,683 A | * | 10/1999 | Cragun et al. ............... 345/327 |
| 5,977,964 A | * | 11/1999 | Williams et al. ............ 345/327 |
| 6,005,562 A | * | 12/1999 | Shiga et al. ................. 345/327 |
| 6,005,563 A | * | 12/1999 | White et al. ................. 345/327 |
| 6,052,716 A | * | 4/2000 | Gibson ........................ 709/217 |
| 6,144,991 A | * | 11/2000 | England ...................... 709/205 |

FOREIGN PATENT DOCUMENTS

| | | |
|---|---|---|
| WO | 9821877 A2 | 5/1998 |
| WO | 9857498 A1 | 12/1998 |

* cited by examiner

*Primary Examiner*—Andrew Faile
*Assistant Examiner*—Krista Bui
(74) *Attorney, Agent, or Firm*—Laurie E. Gathman

(57) ABSTRACT

A radio or television receiver for receiving a plurality of signals, includes a selector for selecting a selected signal and a identifier for assigning an identity to each signal, e.g. a preset number. The receiver includes a history device for maintaining a list of identities of previously selected signals, a navigation device for traversing the list, and for selecting the signal corresponding to the identity at a current position.

7 Claims, 3 Drawing Sheets

APPARATUS FOR RECEIVING SIGNALS

BACKGROUND OF THE INVENTION

1. Field of the Invention

The invention relates to a radio or television receiver for receiving a plurality of signals, comprising selection means for selecting a selected signal and identifying means for assigning an identity to each signal.

2. Description of the Related Art

Such a receiver is widely known. For example, a television receiver (or VCR) comprises tuning means for selecting a TV signal from a plurality of TV channels. Similarly, a radio receiver can tune to a specific radio signal. Such receivers often feature a mechanism for assigning an identity to each channel for the purpose of displaying the selected channel, or enabling a user to select a particular channel. For example, preset numbers are used to identify a channel. The invention also relates to a television receiver comprising teletext means, enabling a user to select a particular page from a plurality of pages, each of which is identified by a unique page number.

Often, users want to return to signals which were visited previously, e.g., when the user wants to match TV programs from a couple of channels at the same time, or when some teletext pages comprise mutually related information. However, this is no trivial task with current radio and television receivers. Users have to remember the identity of a signal they will possibly want to return to in the future, and enter the identity correctly when they actually want to return to the signal. There are TVs exist which offer the possibility to store identities in a 'favorite list'. However, this requires the user to perform explicit actions for storing and removing identities, and such lists need to be updated regularly.

SUMMARY OF THE INVENTION

It is an object of the invention to provide a radio or television receiver which allows easy access to previously selected signals.

To achieve this object, the radio or television receiver according to the invention is characterized in that the receiver further comprises history means for automatically keeping a history list of signal identities in response to a succession of signal selections, the history means further comprising navigation means for changing a current position in the history list and generating a control signal for the selection means to select a signal corresponding to the identity at the current position. Such history means automatically store identities of signals which have been selected recently, and enable the user to easily recall these signals.

In an embodiment, the history means are further adapted to impose an order upon the history list, the navigation means further comprising backward means and/or forward means for changing the current position to a position which precedes or succeeds the current position in accordance with the order. By imposing such an order on the identities in the history list, a simple mechanism can be applied to access all identities in the list, by consistently traversing the list in one or two directions by means of said backward means and/or forward means. In a preferred embodiment, the signal identities in the history list are substantially ordered by ascending recency of storage in the history list. In this way, the signals selected most recently are at the end of the list and can be selected with minimal effort by operating said backward means.

In a further embodiment, the history means further comprise discrimination means for marking the selected signal as being relevant or irrelevant for including its identity in the history list, the history means being further adapted to include the identity of the selected signal only if the selected signal is marked as being relevant. By examining the selection behavior of the user, the history means attempts to deduce whether a particular signal is of current interest to the user, i.e., relevant for including its identity in the history list. Filtering less relevant signals from the history list further enhances the usability of the history means. Various embodiments, defining conditions for signals to be included in the history list, will now be disclosed.

TV channels or teletext pages which have been selected for some predetermined period of time are likely to be of current interest to the user, hence, in an embodiment, they are included in the history list. In a further embodiment, also channels which are selected by explicitly entering their identity, as opposed to zapping, are included in the history list. Most radio or television receivers impose a logical order on the identities of the plurality of signals and provide zapping means for traversing the identities in an ascending or descending direction. For example, presets are often assigned numbers, and said zapping means are generally implemented by an 'up' button and a 'down' button, which select a channel or a teletext page whose number is increased or decreased by one with respect to the number of the currently selected channel or page. Zapping through radio or TV channels is typically performed when the user has no specific intentions or expectations, so most channels selected this way are not likely to be of much interest to the user. In a radio or television receiver according to the invention, signals which are selected by means of the zapping means are not included in the history list, unless they have been inspected for said predetermined period of time.

In a further embodiment, which is particularly useful for teletext, a signal is included in the history list when it was displayed when another signal was selected by explicitly entering its identity. In a teletext system, this guarantees that index pages, comprising numbers of other pages which are likely to be entered explicitly by the user, are included in the history list, hence can be recalled easily.

A further condition for including an identity of a channel or teletext page in the history list is the operation of the navigation means when the channel or page is currently displayed. This guarantees that the channel or page can also be returned to by means of the navigation means. Optionally, the identity can be removed again after returning to it by means of the navigation means.

It is to be noted that television receivers are known which feature a dedicated button for selecting the previous channel. There are also television receivers which feature colored buttons for recalling two previously selected teletext pages which are indicated on the screen in corresponding colors. A drawback of such a feature is that only a very limited number of signals can be accessed and that disturbing elements are required on the screen.

DESCRIPTION OF THE PREFERRED EMBODIMENTS

Figure 1:
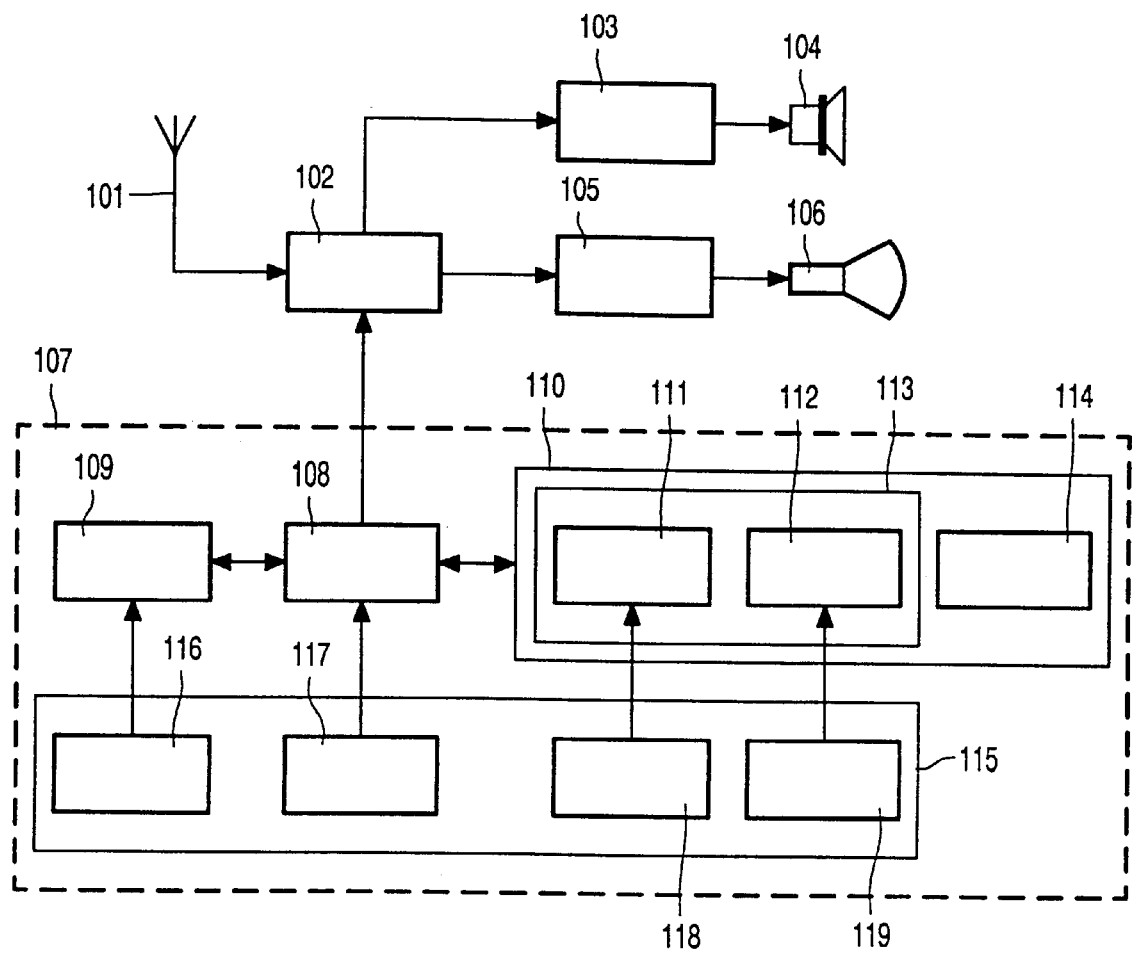
FIG. 1 shows a diagram of a television receiver comprising history means for recalling previously selected channels.

FIG. 1 shows a television receiver according to the invention, comprising an antenna 101 for receiving TV signals from the atmoshphere or from a cable network. Tuning means 102 select one of the received signals and split the signal into an audio signal and a video signal, the audio signal being further processed by an audio processor 103 and a loudspeaker 104, and the video signal being further processed by a video processor 105 and a display screen 106. Control means 107 generate control signals for the tuning means 102, the control signals determining which channel is selected by the tuning means 102. The control means 107 comprise preset means 108, zapping means 109, history means 110 and input means 115. The input means 115 enable a user to control the preset means 108, the zapping means 109, and the history means 110. The history means 110 comprise navigation means 113 and discrimination means 114. The navigation means 113 comprise backward means 111 and forward means 112. The input means 115 comprise a remote control unit accommodating up/down means 116, numerical means 117, a 'backward' button 118 and a 'forward' button 119. The 'backward' button 118 and the 'forward' button 119 are distinct from the up/down means 116 and serve another purpose, as will be explained later.

The preset means 108 assigns an identity to a subset of the received TV-channels in the form of a number in a certain range, e.g., from '1' to '99'. The user can operate the numerical means 117 to enter a preset number. Selecting a preset causes the tuning means 102 to tune to the TV channel to which that preset is assigned. Alternatively, presets can be selected by means of the zapping means 109. The zapping means 109 can be controlled by the up/down means 116, which normally comprises an 'up' button and a 'down' button. If the 'down' button is pressed, the zapping means 109 take the currently selected preset number and control the preset means 108 to select the preset preceding the currently selected preset. For example, if preset '20' is currently selected, pressing the 'down' button would select preset '19'. Similarly, pressing the 'up' button would select preset '21'. The preset means 108 and the zapping means 109 are known per se and are widely applied in radio and television receivers.

Presets can also be selected by means of the history means 110, which keep a record of previously selected presets. These presets can be recalled by operating the 'backward' button 118 which controls the backward means 111, or the 'forward' button 119 which controls the forward means 112. The previously selected presets are stored in a history list, and ordered in accordance with their recency of storage. Pressing the 'backward' button 118 causes a 'current position' to shift one position into the direction of the first position in the history list, and select the corresponding preset. Pressing the 'forward' button 119 causes the position to shift one position into the direction of the last position in the history list, and select the corresponding preset. In this way, the history list can be traversed, and previously selected presets can be recalled. Presets which are selected via the history means 110 are not stored again in the history list, because they are already present in the history list, at the position which is indicated by the current position. The discrimination means 114 serve to assign a status to a selected preset, this status marking the selected preset as being relevant or irrelevant for storing its number in the history list. The decision about the status is based on various conditions, e.g., related to the way the preset was selected. Several embodiments of the history means 110 are possible, which differ in their behavior with respect to storing preset numbers in the history list, removing preset numbers from the history list, the exact order of preset numbers, etc.

Figure 2:
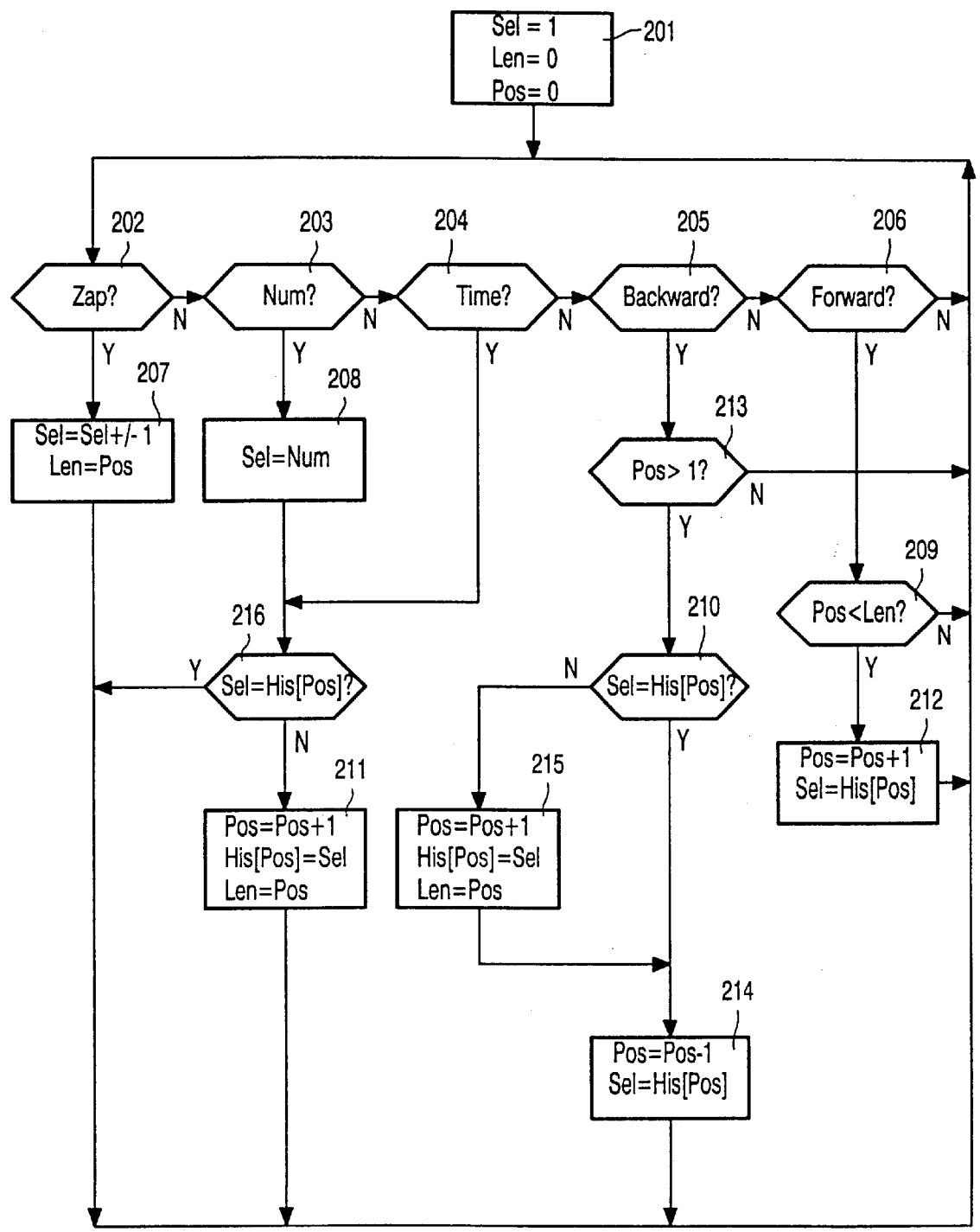
FIG. 2 shows a flow chart of the behaviour of the history means.

FIG. 2 shows a flowchart of the behaviour of one embodiment of the history means. The following variables are introduced for describing a state of the television receiver:

Sel: represents the currently selected preset,
Len: represents the length of the history list, i.e., the number of identities in the list,
Pos: represents the current position within the history list.
The discrimination process carried out by the discrimination means 114 is roughly described by steps 202 to 206 and step 210.

In an initial step 201, actions are included which are performed at power-on. Sel is set to 1, which means that the preset with number '1' is selected initially. Len is set to 0, which means that initially, the history list is empty. Pos is set to 0, which means that there is no current position in the history list. In steps 202 to 206, tests are performed for detecting certain conditions. If the tests have a successful result, steps are performed which can be reached by following the arrows marked 'Y'. If the tests fail, a subsequent test is performed by following the arrows marked 'N'. The order in which the tests are performed is not critical. In practice, they are likely to be implemented in an event-driven way, triggering steps as soon as some condition is satisfied and avoiding the need to perform the steps 202 to 206 cyclically.

The test in the step 203 succeeds if the user enters a preset number Num by means of the numerical means 117. This event causes step 208 and 216 to be performed consecutively. In the step 208, Sel gets the value Num, which means that the preset is selected which corresponds to the number entered. The test in the step 216 succeeds if the currently selected preset corresponds to the preset at the current position in the history list. If the test in the step 216 fails, step 211 is performed. In the step 211, the newly selected preset is appended to the history list, after removing all preset numbers following the current position for reasons which will be explained hereinafter. This is achieved by increasing Pos by 1, storing the number of the newly selected preset at the location indicated by Pos, and making Len equal to Pos. If the current position was already at the last element of the history list, no preset numbers need to be removed and the newly selected preset is simply appended to the history list. If the test in the step 216 succeeds, no further action is performed, because appending the newly selected preset to the history list would yield two identical preset numbers in succession.

Other conditions may cause a newly selected preset not to be stored in the history list, because it is assumed that these conditions render a preset less likely to be recalled later. For example, the test in the step 202 succeeds if the user operates the zapping means 109 by means of the up/down means 116 to select a preset which precedes or succeeds the currently selected preset. If this is the case, the newly selected preset number is not stored in the history list. Only preset numbers following the current position are removed from the history list in step 207, for reasons which will be explained hereinafter. It is assumed that a preset which was selected with the zapping means 109, is generally not of particular interest to the user.

The test in step 204 succeeds as soon as a preset has been selected for a predetermined consecutive period of time, e.g., five minutes. If that is the case, the step 216 is performed, and if it fails, the preset number is appended to the history list in the step 211 as described above. Effectively, the test in the step 204 causes only presets which are selected by means of the zapping means 109 to be included in the history list, because in all other cases the test in the step 216 succeeds and no further action is performed.

Hence, newly selected presets are stored in the history list if they were selected explicitly by means of the numerical means 117 or if they were selected by means of the up/down means 116 and have been selected for a predetermined period of time . This is based on the assumption that these conditions render a preset likely to be recalled later.

The test in step 205 succeeds if the user operates the backward means 111 by means of the 'backward' button 118. If this is the case, the test in step 213 is performed, checking whether the current position Pos is greater than one. If this is the case, the test in step 210 is performed first, checking whether the currently selected preset corresponds to the preset at the current position in the history list. This is the case if the currently selected preset is not selected by means of the zapping means 109. If the test in step 210 succeeds, step 214 is performed, decreasing Pos by one and selecting the corresponding preset, indicated by Sel=His [Pos], thus recalling a preset which was originally selected before the currently selected preset. If the test in the step 210 fails, step 215 is performed first before performing step 214.

The step 215 is identical to the step 211, appending the currently selected preset to the history list, after removing all preset numbers following the current position. Thus the preset is stored in the history list, although the preset was selected by means of the zapping means 109.

The test in the step 206 succeeds if the user operates the forward means 112 by means of the 'forward' button 119. If this is the case, the test in step 209 is performed, checking whether the current position Pos is smaller than the length of the history list, hence not pointing to the last element in the history list. If the test in the step 209 succeeds, the current position Pos is increased by one, and the corresponding preset is selected, indicated by Sel=His [Pos].

In summary, newly selected presets are stored in the history list if they were selected explicitly by means of the numerical means 117 or if they were selected by means of the up/down means 116 and have been selected for a predetermined period of time. The backward means 111 and the forward means 112 enable a user to traverse the history list in two directions by increasing or decreasing the current position, and selecting the preset at the new current position. When the user operates the zapping means 109, the current position remains unchanged, but preset numbers following the current position are removed from the history list, which disables the forward means 112 because of the test in the step 209. Operating the forward means 112 would not make sense, because the user would stop traversing the history list by operating the zapping means 109. The backward means 111 can still be used to recall the preset at the current position. The newly selected preset is not stored in the history list. Only after operating the backward means 111 is the preset stored in the history list as yet, in order to enable the user to reselect the preset by means of the forward means 112.

Only two additional buttons, i.e., the 'backward' button 118 and the 'forward' button 119, are required for implementing the functionality described. In a further embodiment, a third button could be added for displaying the history list on the television screen, enabling the user to select a preset by picking a preset from the history list, similarly to the widely applied on-screen menus. After picking a preset, the current position is set to the preset position in the history list.

The history list could grow indefinitely, so measures have to be taken to avoid memory overflow. A good solution is to 'forget' about presets selected a relatively long time ago, by removing presets at the start of the history list. Another measure is to avoid double occurrences by removing existing occurrences of a newly stored preset.

Various variants are conceivable, which differ in their behavior with respect to storing preset numbers in the history list, removing preset numbers from the history list, the exact order of preset numbers, etc. In the variant described, the history list is truncated after the current position when a new preset has to be stored in the history list, or when the user operates the zapping means 109. This guarantees that the original order of selection is preserved, which is particularly advantageous for teletext pages where there is often a meaningful relationship between successively selected pages. However, a disadvantage is that some signal identities are removed from the history list, hence cannot be recalled easily.

Figure 3:
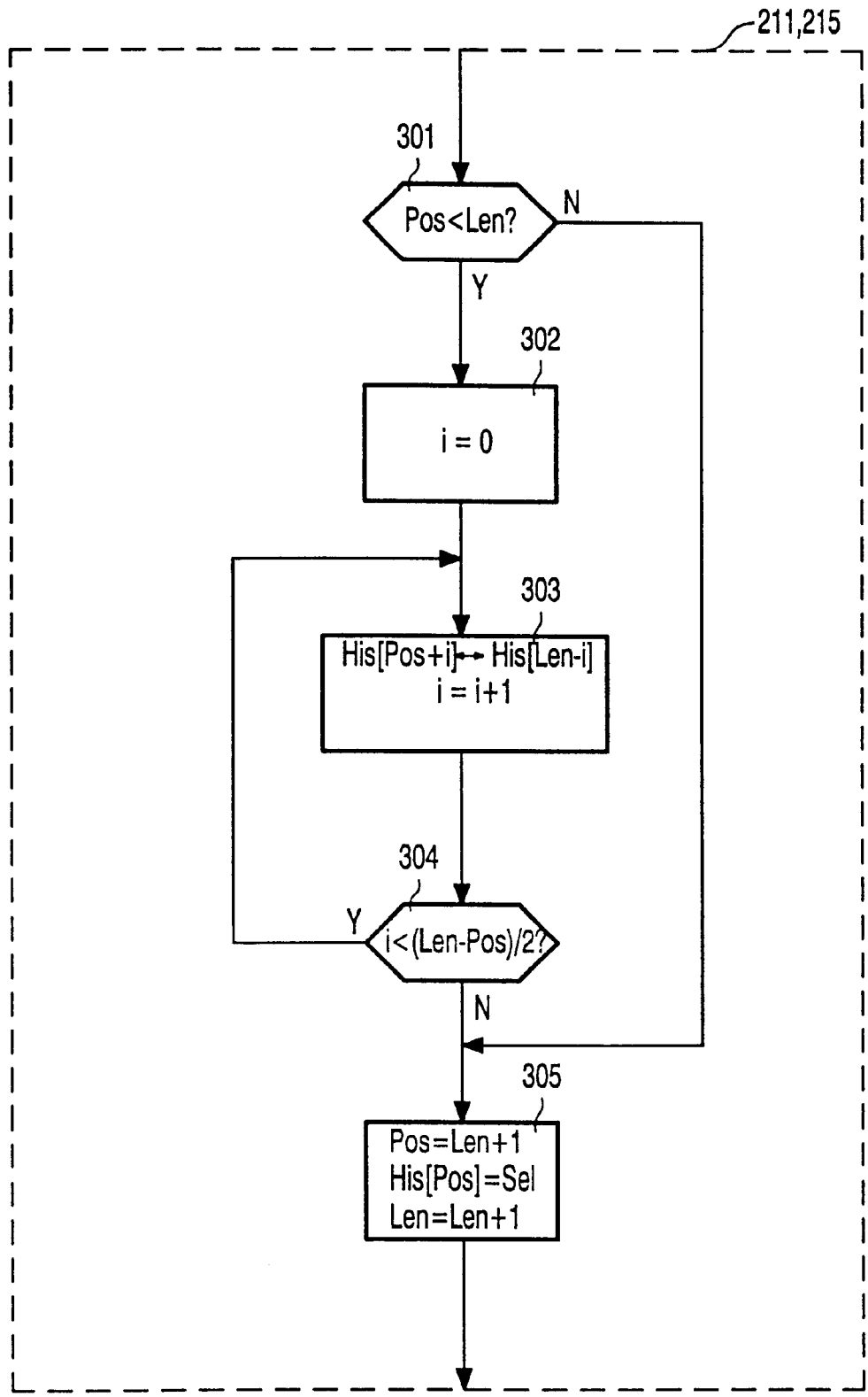
FIG. 3 shows a flow chart of an alternative way of storing a signal identity in the history list.

Instead of removing presets from the history list, newly stored presets could be simply inserted after the current position, enabling the forward means 112 even for newly stored presets. For example, if the history list is given by [1,3,5], the current position being underlined, and preset '6' is selected by entering '6' with the numerical means 117, the new history list would be [1,3,6,5]. In another variant, newly stored presets are appended at the end of the history list. In this variant, it could be convenient to partially reorder the presets in the history list, to obtain an intuitive behavior of the backward means 111. For example, the resulting history list in the example could be [1,5,3,6], and the backward means 111 would select preset '3' as expected. This variant is easily obtained by removing 'Len=Pos' from the step 207 of FIG. 2 and by replacing the steps 211 and 215 by the flowchart shown in FIG. 3. The test in step 301 fails if the current position is at the last element of the history list, in which case the currently selected preset is simply appended to the history list as performed by step 305. If the test in step 301 succeeds, a loop constituted by steps 302, 303 and 304 is performed, after which the sublist starting at the current position and ending at the last position is reversed. An auxiliary variable 'i' gets an initial value '0' in the step 302. In the step 303, each time two opposite elements are exchanged, starting at the elements at the current position and the last element, and proceeding inwardly controlled by the variable 'i' which is increased by one repeatedly. If the middle of the sublist is reached, which is tested in the step 304, the loop ends.

All variants could be applied equally well to presets of a radio receiver, or to teletext pages. For teletext, a slightly different approach could be adopted, i.e., including a page in the history list which was displayed when another page was selected by explicitly entering its number. This guarantees that index pages, comprising numbers of other pages which are likely to be entered explicitly by the user, are included in the history list, and hence, can be recalled easily by means of the backward means 111. The explicitly selected pages themselves could be left out of the history list, as opposed to the variant of FIG. 2, as well as pages which have been selected for a predetermined period of time.

In a further embodiment, the history means are entirely incorporated in a control apparatus, e.g., a remote control unit for a television receiver. Incorporating the history means in a universal remote control unit enables the functionality of existing equipment to be extended with a history function according to the invention at very low cost. The remote control unit comprises numerical input means, e.g., for entering preset or page numbers, and zapping means, e.g., an 'up' button and a 'down' button, for increasing or decreasing the last input number by one. The remote control unit further comprises means for adapting the interpretation of entered digits to the remote-controlled apparatus. Various approaches are known for distinguishing between separate digits and complete numbers. For example, a user is asked to specify beforehand whether a single digit or double digit number will be entered. Alternatively, digits which are entered within a certain period of time are considered to belong to one number. The controlled apparatus and the remote control unit should interpret entered digits in the same way. The remote control unit further comprises history means, for example as described above and depicted in FIGS. 2 and 3. The history means keep a history list of numbers which are explicitly entered. If, after a zapping operation, no relevant actions are performed for a certain period of time, the history means store a number in the history list which is derived from the most recent number and subsequent zapping operations. For example, if subsequently to entering a number '12', is entered, the 'up' button is pressed twice and the 'down' button is pressed once, and then no further action is performed during a predetermined time interval, while the number '13' is stored in the history list. The remote control unit further comprises 'backward' and 'forward' buttons for traversing the history list as described hereinbefore, causing the number at the current position to be transmitted.

What is claimed is:

1. A radio or television receiver for receiving a plurality of signals, comprising:

selection means for selecting a selected signal from said plurality of signals; and identifying means for assigning an identity to each signal of said plurality of signals, characterized in that the receiver further comprises:

history means comprising memory means for storing, automatically, a history list of signal identities in response to a succession of signal selections, navigation means for changing a current position in the history list and generating a control signal for the selection means to select a signal corresponding to the signal identity at the current position, and wherein the discrimination means are further adapted to mark the selected signal as being relevant if it has been selected for at least a predetermined period of time or it has been selected by explicitly entering its identity, regardless of the time viewed.

2. A radio or television receiver as claimed in claim 1, characterized in that the history means further comprises means for imposing an order upon the history list in said memory means, the navigation means further comprising backward means and/or forward means for changing the current position to a position which precedes or succeeds the current position in accordance with the order.

3. A radio or television receiver as claimed in claim 2, characterized in that the signal identities in the history list are substantially ordered by ascending recency of storage in the history list.

4. A radio or television receiver as claimed in claim 1, wherein the receiver further comprising input means for entering a signal identity and for selecting the corresponding signal, characterized in that the discrimination means marks the selected signal as being relevant if a further signal is selected by means of the input means.

5. A radio or television receiver as claimed in claim 1, characterized in that the discrimination means marks the selected signal as being relevant if a further signal is selected by the navigation means.

6. A radio or television receiver as claimed in claim 1, characterized in that the plurality of signals are radio or television channels, and the identities are preset numbers.

7. A television receiver as claimed in claim 1, characterized in that the plurality of signals are teletext pages, and the identities are page numbers.

* * * * *